United States Patent
Khoo et al.

(10) Patent No.: US 7,589,542 B2
(45) Date of Patent: Sep. 15, 2009

(54) HYBRID PROBE FOR TESTING SEMICONDUCTOR DEVICES

(75) Inventors: Melvin Khoo, San Gabriel, CA (US); Nim Tea, Orange, CA (US); Zhiyong An, Los Angeles, CA (US); Ting Hu, Monrovia, CA (US)

(73) Assignee: Touchdown Technologies Inc., Palo Alto, CA (US)

( * ) Notice: Subject to any disclaimer, the term of this patent is extended or adjusted under 35 U.S.C. 154(b) by 0 days.

(21) Appl. No.: 11/734,434

(22) Filed: Apr. 12, 2007

(65) Prior Publication Data

US 2008/0252310 A1 Oct. 16, 2008

(51) Int. Cl.
*G01R 31/02* (2006.01)
(52) U.S. Cl. ....................... 324/754; 324/762
(58) Field of Classification Search ........................ None
See application file for complete search history.

(56) References Cited

U.S. PATENT DOCUMENTS 5,973,394 A * 10/1999 Slocum et al. .............. 257/690
6,771,084 B2 * 8/2004 Di Stefano ................. 324/754
2007/0024298 A1 * 2/2007 Khoo et al. ................. 324/754
2008/0160842 A1 * 7/2008 Polnyi et al. ............... 439/862

* cited by examiner

*Primary Examiner*—Minh N Tang
(74) *Attorney, Agent, or Firm*—Manuel F. de la Cerra

(57) ABSTRACT

A hybrid probe design is presented that includes a torsion element and a bending element. These elements allow the probe to store the displacement energy as torsion or as bending. The probe includes a base, a torsion element, a bending element, and a tip. The probe elastically deforms to absorb the displacement energy as the probe tip contacts the DUT contact pad. The bending element absorbs some of the displacement energy through bending. Because the torsion element and the bending element join at an angle, a portion of the displacement energy is transferred to the torsion element causing it to twist (torque). The torsion element can also bend to accommodate the storage of energy through torsion and bending. Adjusting the position of a pivot can alter the probe's energy absorption characteristics. One or more additional angular elements may be added to change the energy absorption characteristics of the probe.

28 Claims, 6 Drawing Sheets

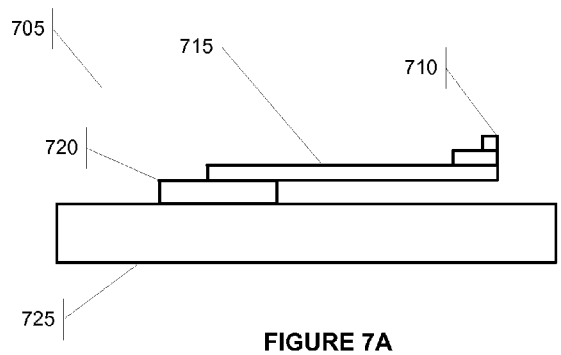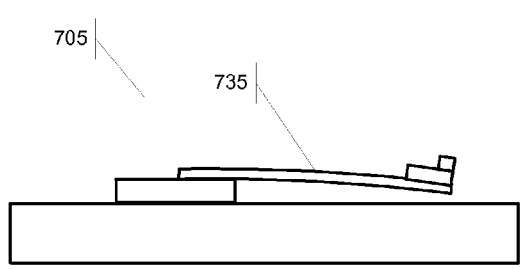
FIGURE 7A          FIGURE 7B
(Prior Art)
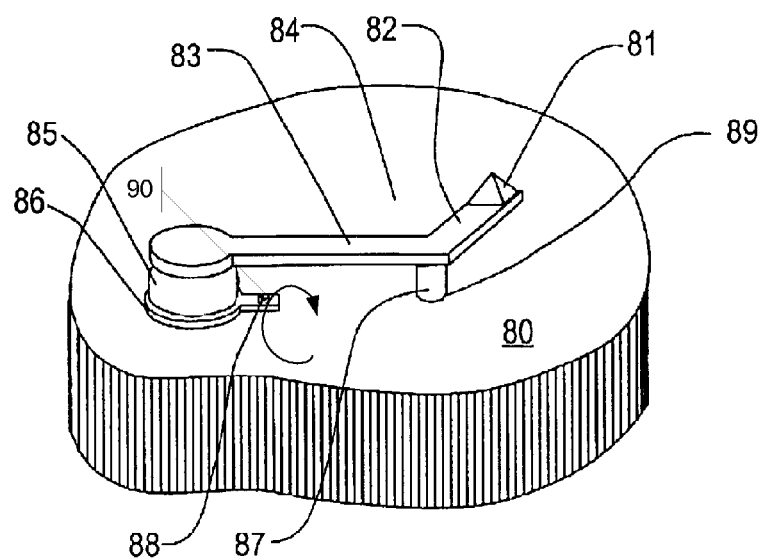
FIGURE 9
(Prior Art)

HYBRID PROBE FOR TESTING SEMICONDUCTOR DEVICES

FIELD OF THE INVENTION

The present invention relates to devices for testing semiconductor devices and more particularly to the design of probe contactors for such testing.

BACKGROUND OF THE INVENTION

Integrated circuits are made in a bulk parallel process by patterning and processing semiconductor wafers. Each wafer contains many identical copies of the same integrated circuit referred to as a "die." It may be preferable to test the semiconductor wafers before the die is cut into individual integrated circuits and packaged for sale. If defects are detected the defective die can be culled before wasting resources packaging a defective part. The individual die can also be tested after they have been cut into individual integrated circuits and packaged.

To test a wafer or an individual die—commonly called the device under test or DUT—a probe card is commonly used which comes into contact with the surface of the DUT. The probe card generally contains three unique characteristics: (1) an XY array of individual probes that move in the Z direction to allow contact with the die pad; (2) an electrical interface to connect the card to a circuit test apparatus; and (3) a rigid reference plane defined in such a way that the probe card can be accurately mounted in the proper location. When the probe card is brought in contact with the die pad, the Z-direction movement allows for a solid contact with the probe tip. The probe card ultimately provides an electrical interface that allows a circuit test apparatus to be temporarily connected to the DUT. This method of die testing is extremely efficient because many die can be tested at the same time. To drive this efficiency even higher, probe card manufactures are making larger probe cards with an ever-increasing numbers of probes.

Currently two types of probe designs are used to test a semiconductor die—cantilever and torsional. FIGS. 7A and 7B illustrate a conventional cantilever probe. The probe (705) comprises a probe tip (710), a bending element (715), and a probe base (720), which is mounted to a substrate (725). This entire structure is referred to herein as the probe card. The entire probe card is generally moved in the Z-direction (depicted by arrow 730) causing the bending element (715) to bend allowing the probe tip (710) to come into contact with the die pad that is under test. FIG. 7B illustrates how the probe bending element (735) bends while being brought into contact with the die. As an individual probe travels to make contact with the DUT contact pad (this event is called a touchdown), the probe tip scrubs the contact pad, which perfects an electrical contact with the die such that testing can commence. The die contact pads, which are typically aluminum, are often coated with a thin layer of aluminum oxide, or other protective coating, and the probe tip must cut through the coating to perfect the electrical connection. Once testing is complete, the probe (705) is moved away from the die pad and the probe springs back to its original position.

The cantilever design, however, has several shortcomings. Typical cantilever probes are designed with long bending elements, which during touchdown, the probe tip presents a smaller tip contact angle (as compared to the same sized tip on a typical torsion probe design). This results in a larger tip contact area and a larger probe force is thus needed to pierce the aluminum oxide layer. When you multiply this force by the hundreds or thousands of probes on a probe card, the probe card must be engineered to accommodate significant forces, which usually means reinforcing the probe card components, which in turn increases probe card costs.

Another shortcoming is the inefficient distribution of stresses. During touchdown, a cantilever probe bends, which creates stresses on the probe that appear concentrated at the top and bottom surfaces of the bending element near the probe base end of the probe. FIG. 8A illustrates a length-wise cross-sectional view of the stresses experienced by the bending element of a cantilever probe, while FIG. 8B illustrates the width-wise cross-sectional views (Sections A-A and B-B) of the stresses at each end of the element. The left side of the figure, near Section A-A, (indicated by part 805) is the part of the bending element that is near the probe base, with the right side, near Section B-B, (part 810) near the probe tip. The area of the bending element that experiences stresses which are greater than 50% of the maximum stress is shown hatched (815). The corresponding volume of the bending bar that experiences greater than 50% of maximum stress is about 25% of the total cantilever bar volume, and that volume is localized near the probe base (805). The opposite side of the bending bar (810) experiences very low stress. It is clear from FIGS. 8A and 8B that the stress distribution is inefficient because only small portions of the bending element absorb the stress. And it is in these small portions where the probe is more likely to fail forcing manufacturers to widen the bending element at the probe foot to reduce stress and prevent failures. A wider bending element near the probe base, however, adversely affects the packing density of the probe card.

The second type of probe is based on a torsional design which was developed to overcome some of these drawbacks. For example, U.S. Pat. No. 6,426,638 describes a torsion spring design. FIG. 9 illustrates a torsional probe design. As the probe tip (81) comes in contact with the DUT contact pad, it moves flexibly in response to force applied vertically to the tip (81). Vertical movement of the tip (81) depresses the arm (82) and torsionally flexes the torsion element (83) in the direction indicated by arrow (90). The torsion element (83) serves as a torsional spring, thereby impressing a restoring force on the tip (81).

Torsional designs have some advantages over cantilever designs. Typical torsional probes are designed with short arms, which during touchdown, the probe tip presents a larger tip contact angle (as compared to the same sized tip on a typical cantilever probe design). This results in a smaller tip contact area and a smaller probe force is thus needed to pierce the aluminum oxide layer, which in turn, reduces the overall force exerted by the probe card. Reduced overall force is advantageous because the probe card does not need to be reinforced as much as a comparable cantilever design, thereby reducing manufacturing costs.

Finally, the torsional design more efficiently distributes stress across the entire volume of the torsion element. FIG. 10A illustrates a length-wise cross-sectional view of the stresses experienced by the torsion element, while FIG. 10B illustrates the width-wise cross-sectional views (Sections C-C and D-D) of the stresses at each end of the element. The area of the torsion element that experiences stresses that are greater than 50% of the maximum stress is shown hatched area (1005), with the center of the torsion element (1010) experiencing the least amount of stress. The corresponding volume of the torsion element that experiences greater than 50% of maximum stress is about 60% of the total torsion element volume. Unlike a cantilever design, this stress is experienced throughout the entire length of the torsion element, and it is not localized at the probe base. It is therefore more efficient to make the width of the torsion bar uniform, thereby also improving the packing density.

Unfortunately though, the torsional probe too has drawbacks. First, for a typical torsional design with a shorter geometry of the arm, the scrub length is generally longer which can limit the size of contact pads for the DUTs. Second, again because of the typically shorter geometry of the arm, a small z-deformation in the torsion element can translate into a larger z-shift at the probe tip. This z-deformation may be caused by material fatigue.

What is needed, therefore, is a probe that exploits the advantages of both the torsional and cantilever probe designs while reducing their associated shortcomings.

SUMMARY OF THE INVENTION

The present disclosure provides a novel hybrid probe design for use in a novel probe card that addresses the shortcomings of the prior art by allowing the probe to store the displacement energy as torsion and as bending. Specifically, the novel probe card comprises a substrate, a pivot and a hybrid probe connected to the substrate. The probe further comprises a base that is connected to the substrate, a torsion element connected to the base, a bending element connected to the torsion element through a union angle, and a probe tip connected to the bending element. The probe elastically stores displacement energy while the probe tip contacts the DUT. The torsion element is adapted to twist such that the torsion element elastically stores a first portion of displacement energy and the bending element is adapted to bend such that the bending element elastically stores a second portion of the displacement energy.

In another embodiment, increasing the gap between hybrid probe and the pivot would allow the torsion element to bend and store energy through bending as well as torsion. In yet another embodiment, adjusting the position of the pivot changes the energy absorption or distribution characteristics of the probe by transforming the torsion element into a torsion/bending element. In another embodiment, the probe comprises one or more additional angular elements that change the energy absorption or distribution characteristics of the probe. In all of these embodiments, manipulating the angle of the union between the torsion and bending elements and/or the additional angular elements changes the probe's characteristics.

Finally, the moment of inertia for the torsion and/or bending elements can be lowered, thus altering the energy absorption or distribution characteristics by making the element longer and/or narrower/thinner and also by manipulating the material used (i.e., a material with a lower Young's Modulus). Conversely, the moment of inertia can be increased by using a material that is less pliable (higher Young's Modulus) and by making the element shorter and/or wider/thicker. Also, a split bar or double-layer structure design can be used to achieve a higher moment of inertia. In yet another embodiment, the hybrid probe may use multiple materials such as one for the bending element and another for the torsion element. Fine tuning the hybrid probe through pivot placement, additional angular elements, and modifications to moments of inertia allows a probe card manufacturer to optimize a probe card for a particular application, further increasing the probe card efficiency and cost effectiveness.

BRIEF DESCRIPTION OF THE DRAWINGS

FIGS. 7A and 7B illustrate a cantilever probe.

FIG. 9 illustrates a torsional probe.

FIGS. 10A and 8B are a length-wise cross-section and width-wise cross-sections, respectively, of the stresses experienced by the torsion element of a torsional probe.

DETAILED DESCRIPTION OF THE PREFERRED EMBODIMENTS

What is described below is a novel hybrid probe design that comprises a torsion element and a bending element. Both of these elements allow the hybrid probe to store the displacement energy through torsion and bending. The hybrid design exploits the advantages of both the torsional and cantilever probe designs (i.e., greater packing density, less probe failure from material fatigue, less probe card force, and shorter scrub lengths), while minimizing the disadvantages of a non-hybrid design. The hybrid design can be used to manufacture a probe card that is optimized to a particular application, further increasing the probe card efficiency and cost effectiveness.

Figure 1:
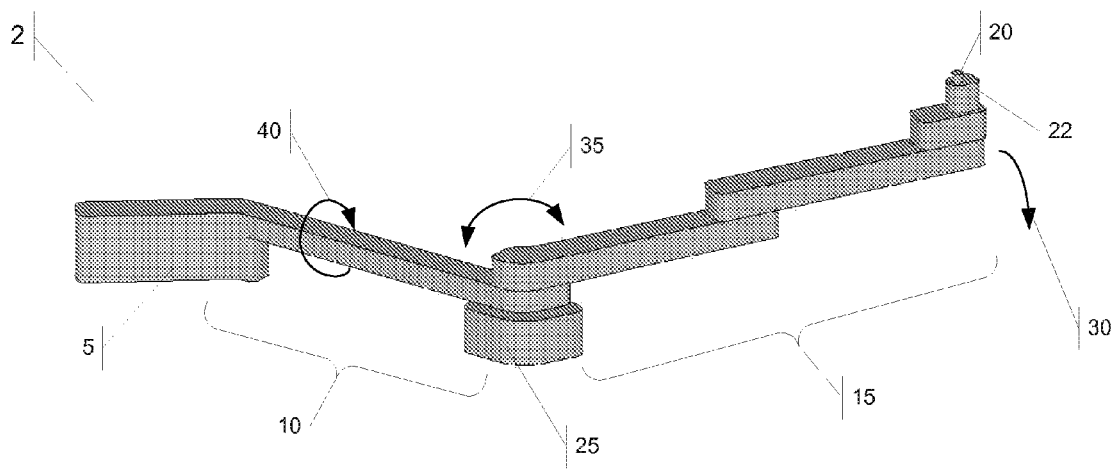
FIG. 1 illustrates an embodiment of a novel hybrid probe design with both torsion and bending elements.

FIG. 1 presents an embodiment of a novel hybrid probe (2). The hybrid probe (2) comprises a probe base (5) connected to the substrate, the torsion element (10), the bending element (15), the probe tip (20) and a probe post (22). A portion of the probe (2) may contact the pivot (25) during touchdown, and the pivot is also connected to the substrate. When the probe tip (20) comes into contact with the DUT contact pad (i.e., during a touchdown), the bending element (15) moves in the direction of arrow 30. The probe (2) must absorb the displacement energy caused by this movement. After the probe (2) completes its testing of the DUT, the stored displacement energy causes the probe (2) to spring back to its original position. Because the torsion element (10) and bending element (15) join at an angle (35), a portion of the displacement energy of the bending element is transferred to the torsion element (10) causing the torsion element (10) to twist in the direction of arrow 40. In this embodiment, angle (35) is about 125 degrees (referenced from 0 degrees in the direction of the torsion element (10)); however, as discussed below, this angle can be adjusted from 90 to 270 to alter the characteristics of the hybrid probe. The bending element (15) is long and thin and thus will have a low moment of inertia and will be able to bend as in a non-hybrid cantilever design, storing a portion of the displacement energy.

The embodiment just described with reference to FIG. 1 contained a short torsion element (10) and a long and thin bending element (15). While this probe (2) on the whole acts like a hybrid, because the bending element has a lower moment of inertia it will act more like a cantilever than a torsional probe. In fact, probe (2) stores displacement energy as both torsion and bending in approximately the following ratio 35:65. Thus, in comparison to a hybrid that acts more torsional (described below), the embodiment in FIG. 1 would have a shorter scrub length and due to its smaller contact angle would present a larger contact area with the DUT contact pad, requiring a larger force to pierce the aluminum oxide layer.

The novel hybrid probe design can be adjusted to meet particular applications. For example, the bending element (15) could be made with a low moment of inertia, such that the hybrid probe (2) will act more like a cantilever probe. Specifically, a bending element (15) with a low moment of inertia would absorb more of the displacement energy, with less of that energy translated to the torsion element (10). This adjustment can be realized by making the bending element (15) longer and/or thinner and also by manipulating the material used (i.e., a material with a low Young's Modulus). With such an adjustment, the novel probe could absorb the displacement energy in a 15:85 torsion/bending ratio. Conversely, the bending element (15) can be constructed with a higher moment of inertia by making it shorter and/or thicker, and also by using a material that is less pliable. These adjustments would shift the energy absorption ratio in favor of torsional energy absorption.

Similarly, the torsion element (10) can be made with a lower polar moment of inertia, such that the hybrid probe (2) will act more like a torsional probe. This adjustment can be realized by making the torsion element (10) longer and/or thinner and also by manipulating the material used (i.e., a material with a low Young's Modulus). A torsion element (10) with a low polar moment of inertia could absorb more of the displacement energy from the bending element (15). In this configuration, the energy absorption ratio could approach 85:15 torsion/bending. Conversely, the torsion element (10) may be manufactured with a high polar moment of inertia by making it from a less pliable material, or the torsion element (10) can be constructed shorter and/or thicker or wider. Increasing the polar moment of inertia would shift the energy absorption in favor of bending energy absorption. Ultimately, using both torsion and bending elements to absorb the displacement energy of the movement is advantageous because the entire probe (2) is used for energy absorption; thus, the probe (2) is less likely to need reinforced, over-engineered components to operate effectively and efficiently.

The probe may be constructed using several techniques, including those described in U.S. patent application Ser. Nos. 11/019,912 and 11/102,982, both commonly owned by the present applicant and hereby also incorporated by reference. Those two applications describe the use of general photolithographic pattern-plating techniques combined with the use of sacrificial metals to further create microstructures such as probes. The probes may be manufactured using several types of materials. The most common of which are nickel alloys that are high performance and preferably plateable. Such alloys may include NiCo and NiMn, with NiMn being more pliable—i.e., the lowest Young's Modulus.

U.S. patent application Ser. No. 11/194,801 teaches forming different parts of the probe during different layers of photolithography, a feature made possible using the photolithography process described in U.S. application Ser. Nos. 11/019,912 and 11/102,982. Using this technique, it is possible to manufacture the various parts of the probe with different materials, which allow for further fine tuning of the hybrid probe characteristics. For example, to obtain a more torsional hybrid probe the torsion element may be made of NiMn (more pliable), while the bending element is made of NiCo (less pliable). Should one desire a more cantilever hybrid then one could exchange this material selection.

U.S. patent application Ser. No. 11/194,801 also teaches a novel probe tip to ensure that the machine vision systems can optically differentiate the probe tip from the probe post. For example, the probe post can be manufactured with a roughened surface. The surface may be roughened prior to lithographically pattern-plating the pro11be tip on the probe post, so the probe tip is plated directly on the roughened surface. The roughened surface can be formed by plating metals and alloys such as Ni, Ni alloys such as NiMn, NiCo, NiW, or NiFe, W alloys such as CoW, Cr or similar metals at a high current, or by the addition of grain refiners or other additives such as Mn salt in a Ni Sulfamate bath, or in any other manner known in the art of electroplating and electroforming to create a roughened surface. Ultimately, light that is reflected back from the roughened surface is diffused and scattered. This helps the automatic vision systems to resolve the probe tip more clearly by providing greatly improved contrast between the probe tip and the probe post surface(s).

Figure 2:
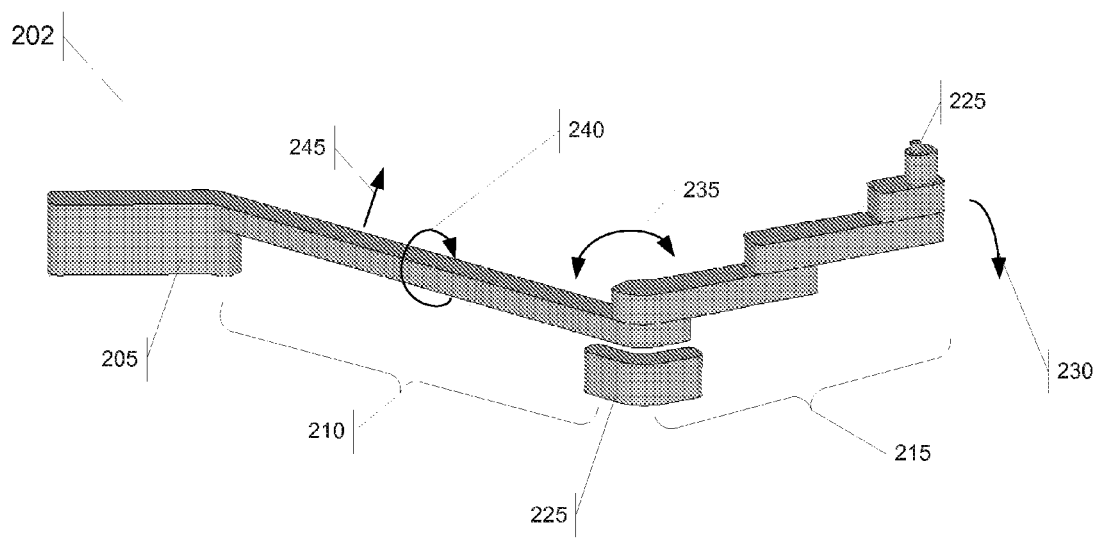
FIG. 2 illustrates an embodiment of a novel hybrid probe design with both torsion and bending elements.

FIG. 2 represents another hybrid probe (202) design in which the torsion and bending elements have been manipulated relative to the embodiment of FIG. 1. The probe (202) comprises a probe base (205) connected to a substrate, a torsion/bending element (210), a bending element (215), and a probe tip (220). A portion of the probe (202) may come into contact with the pivot (225) that is connected to the substrate. When the probe tip (220) contacts the DUT contact pad, the bending element (215) moves in the direction of arrow 230, and the energy from this displacement is translated to the torsion/bending element (210) through the union angle (235), which in this example is again 125 degrees, causing twist in the direction of arrow 240. It would be apparent that the union angle can be adjusted as needed. As compared to the embodiment of FIG. 1, the bending element (215) is shorter which would cause it to have a higher moment of inertia and would bend less. Additionally, the torsion/bending element (210) is longer, causing it to have a lower polar moment of inertia such that the hybrid probe (202) will act more like a torsional probe. It is important to note that the longer torsion/bending element (210) would also have a low moment of inertia such that it could bend in the direction of arrow 245. In addition, the pivot can be placed lower or farther down from the torsion/bending element so that it could bend more in the direction of arrow 245. Thus, the novel hybrid probe need not have two distinct structures that perform the torsion and bending energy absorption; rather those may be performed by a single structure. In this embodiment, probe (202) stores the torsion and bending energy in approximately the following ratio 35:65.

Figure 3:
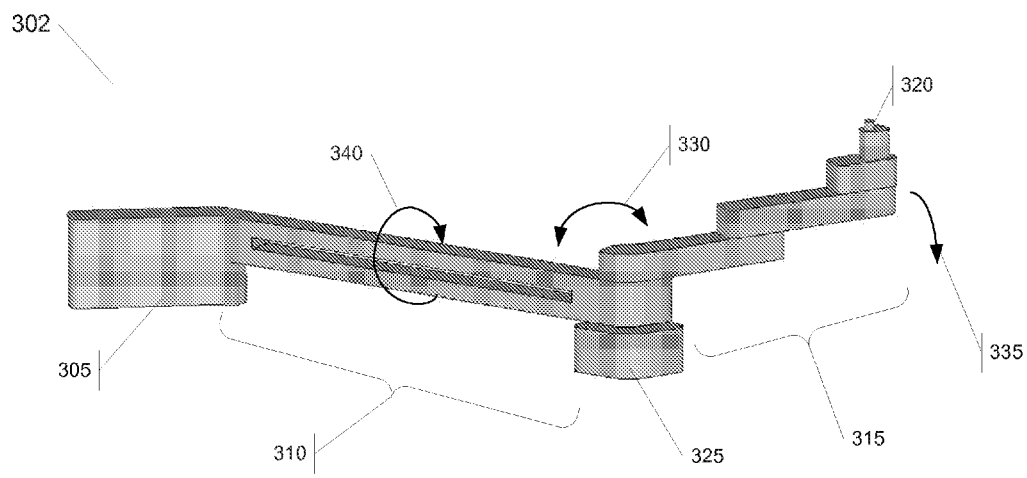
FIG. 3 presents an embodiment of a novel hybrid probe design with a split bar torsion element and a bending element.

FIG. 3 represents yet another hybrid probe (302) design in which the torsion and bending elements have been modified. The probe (302) comprises a probe base (305) connected to a substrate, a torsion element (310), a bending element (315), and a probe tip (320). A portion of the probe (302) may come into contact with the pivot (325) connected to the substrate. Because of the union angle (330), when the bending element (315) moves in the direction of arrow 335 the displacement energy is translated to the torsion element (310), which then twists in the direction of arrow 340. As compared the embodiment of FIG. 2, the torsion element (310) is shorter and is comprised of a split bar that may allow for a lower amount of polar inertia. The split bar is advantageous because it may be easier to manufacture than a solid bar of the same effective thickness. The hybrid probe (302) of FIG. 3 will allow for more torsional energy absorption than the embodiment described with reference to FIG. 2. Ultimately, probe (302) stores the torsion and bending energy in approximately the following ratio 65:35.

Figure 4A:
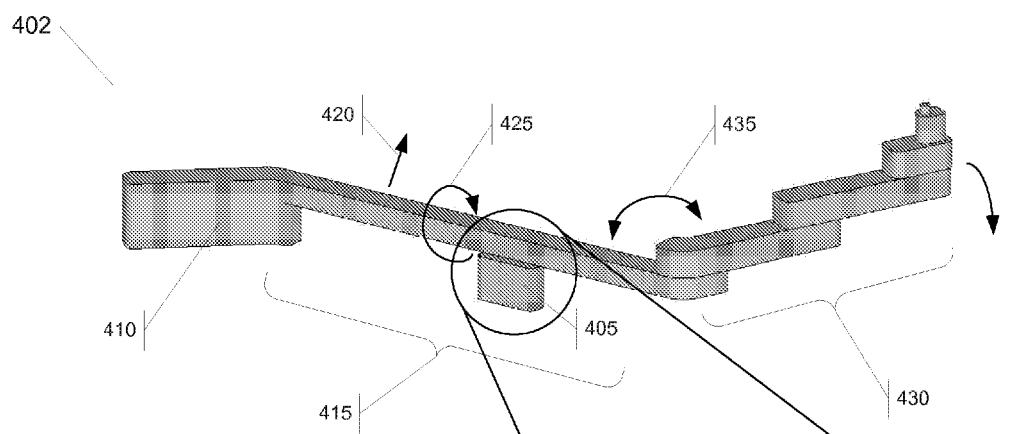
FIGS. 4A and 4B illustrate an embodiment of a novel hybrid probe design with pivot alterations.

In addition to manipulating moments of inertia for torsion and bending elements, manipulating the placement and height of the pivot can also fine tune the performance of the hybrid probe. FIG. 4A illustrates a hybrid probe (402) that is similar to the probe already described with reference to FIG. 2. The difference is that the placement of the pivot (405) is closer to the probe base (410). This placement causes the torsion/bending element (415) to bend in the direction of arrow 420 more than the probe in FIG. 2. In the pivot's (405) current placement, the torsion/bending element (415) still performs both types of energy absorption (torsional as shown by arrow 425, and bending as shown by arrow 420), and the probe (402), as a whole, stores torsion/bending energy in approximately the following ratio 30:70.

If the pivot (405) were placed immediately next to the probe base (410), then the torsion/bending element (415) would perform very little torsional energy absorption; rather most of the energy would be stored as bending by both the torsion/bending element (415) and the bending element (430). And by placing the pivot (405) in the position immediately below the union angle (435), the torsion/bending element (415) would experience the most torsional energy adsorption. From these two extreme pivot (405) positions, it would be apparent to one of skill in the art that a minor movement of the pivot (405) can fine tune the torsional/bending characteristics of the hybrid probe (402).

Figure 4B:
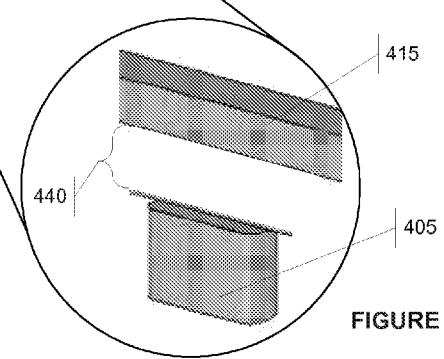

FIG. 4B illustrates an enlarged view of the portion of the torsion bending/element (415) that comes into contact with the pivot (405). This embodiment varies from the embodiment shown in FIG. 4A in that the torsion/bending element (415) is placed at a larger gap (440) from the pivot (405). The gap (440) allows the torsion/bending element (415) to bend and store energy through bending as well as torsion. Thus, manipulating the height of the pivot for any of the embodiments described herein also may alter the energy absorption characteristics of the hybrid probe.

Figure 5:
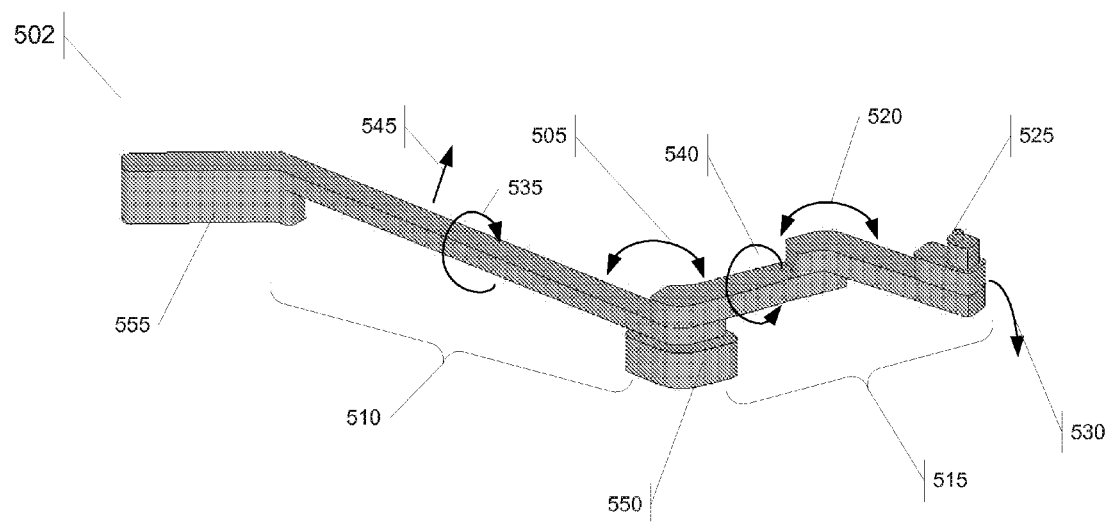
FIG. 5 illustrates an embodiment of a novel hybrid probe design with additional angular elements.
Figure 6:
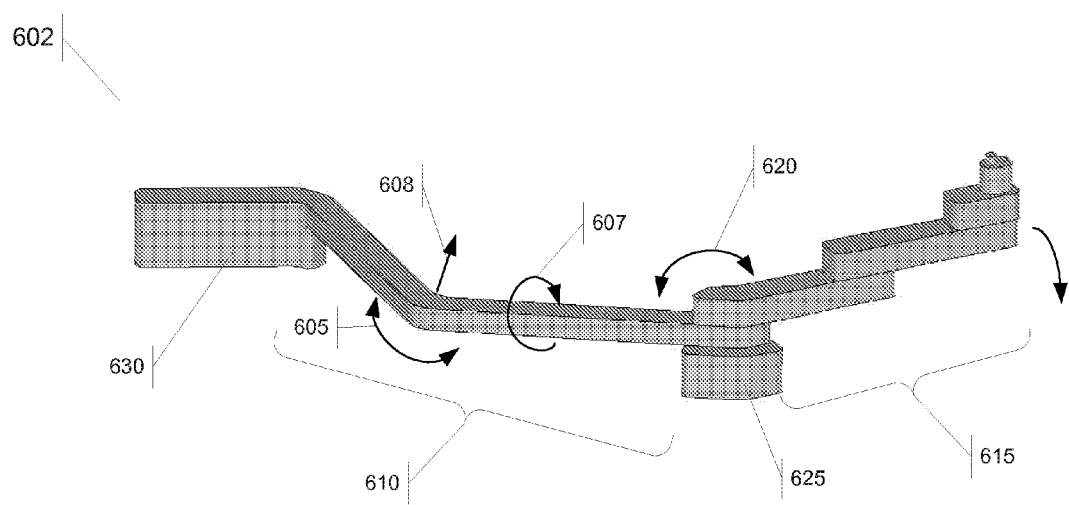
FIG. 6 illustrates an embodiment of a novel hybrid probe design with additional angular elements.
Figures 8A, 8B:
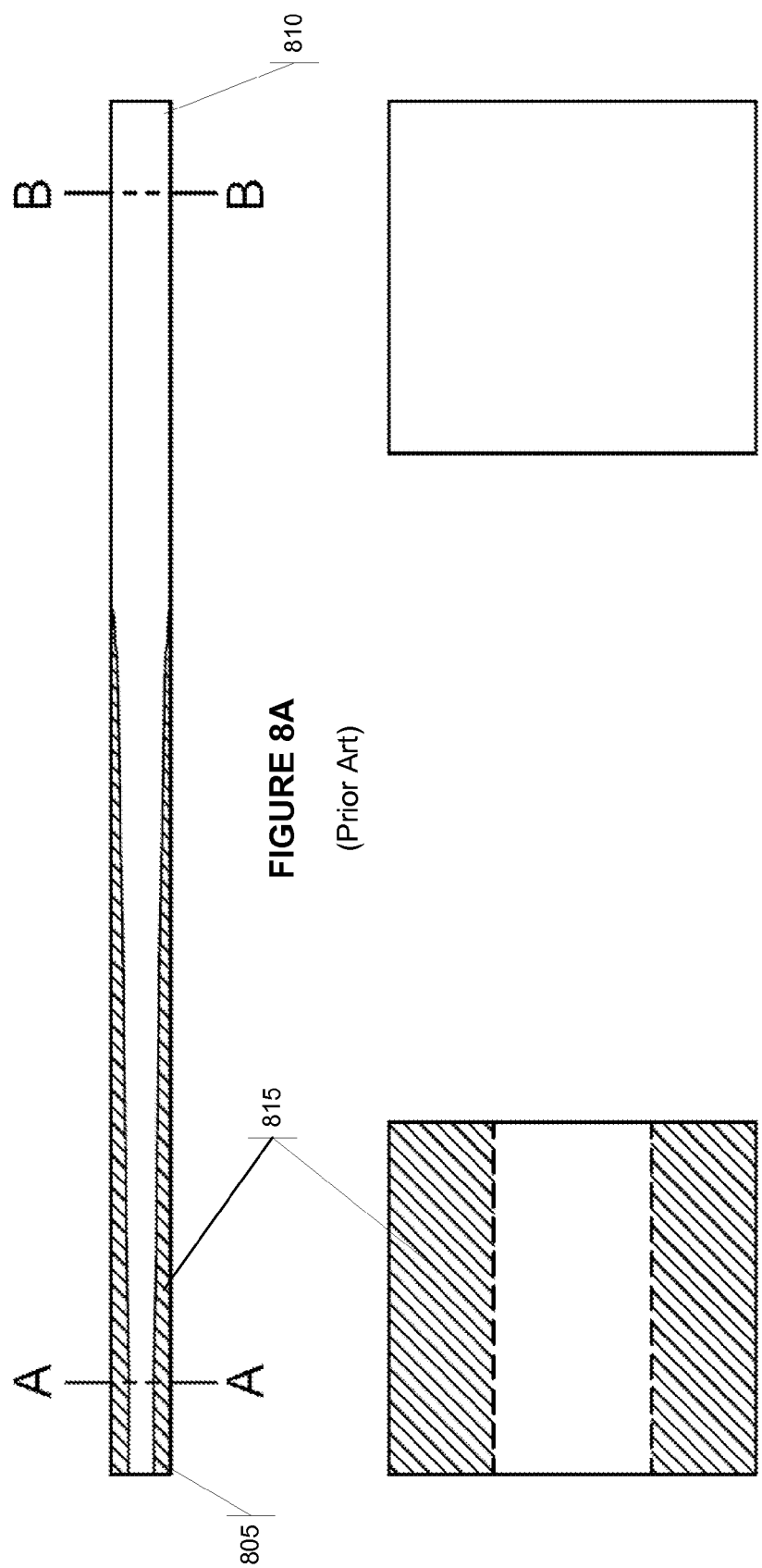
FIGS. 8A and 8B are a length-wise cross-section and width-wise cross-sections, respectively, of the stresses experienced by the bending element of a cantilever probe.
Figures 10A, 10B:
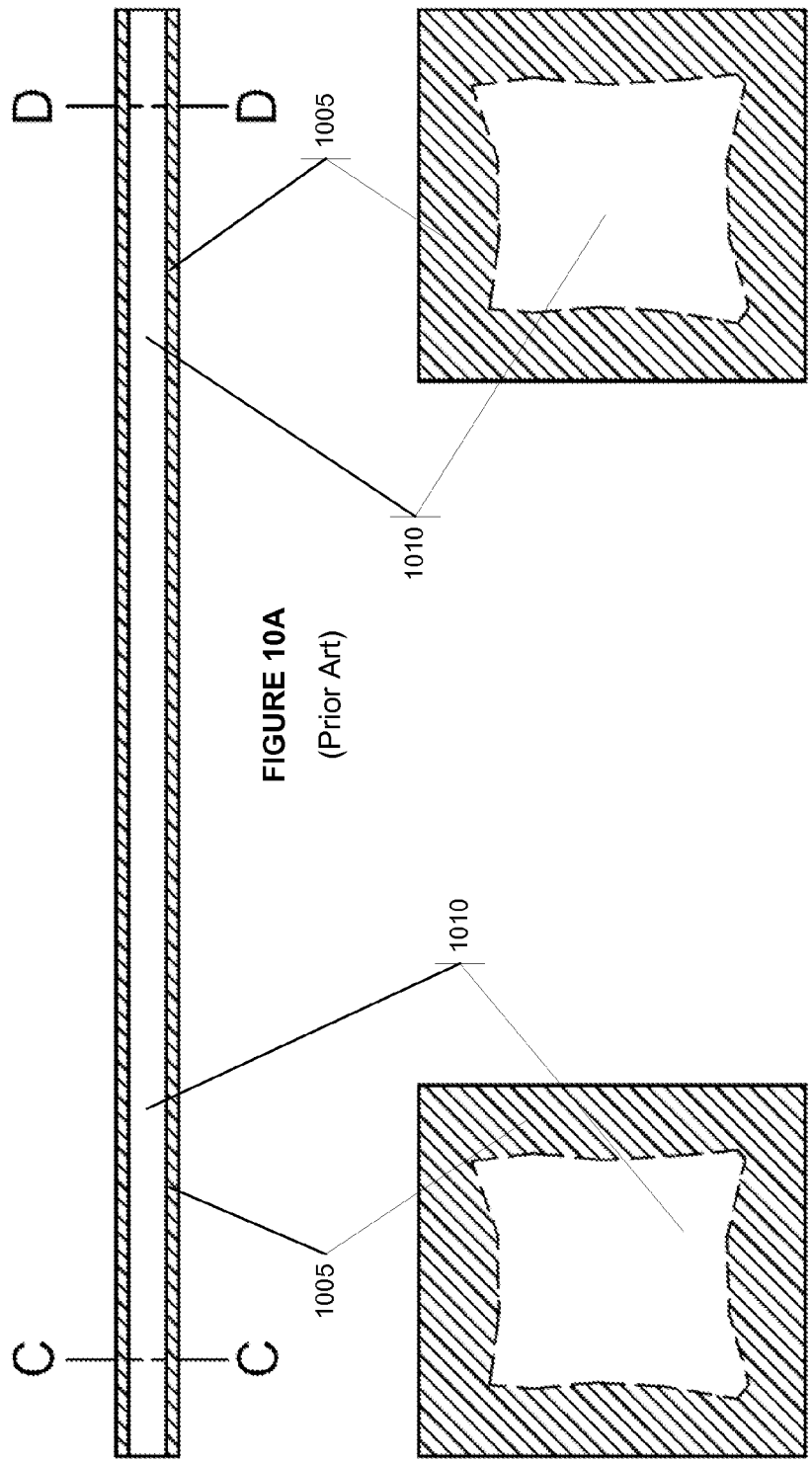

FIGS. 5 and 6 illustrate the use of additional angular elements that further fine tune the torsional/bending characteristics of the hybrid probe. Specifically, the probe (502) depicted in FIG. 5 contains an angular union (505) connecting the torsion element (510) to the torsion/bending element (515). The element (515) is both torsion and bending because of the additional angular element (520). When the probe tip (525) contacts the DUT contact pad, the probe tip moves in the direction of arrow 530. The energy from this movement is absorbed by both the torsion element (510) twisting the direction of arrow 535 and by the torsion/bending element (515) bending. Because of the angular element (520), the torsion/bending element (515) also twists in the direction of arrow 540, resulting in a torsion/bending energy absorption of about 40:60 for the probe (502). The torsion element (510) can be modified so as to have a lower moment of inertia, such that this element also bends more in the direction of arrow 545, storing more of the displacement energy as a cantilever. As described above, the pivot (550) may be moved towards the probe base (555) causing the torsion element (510) to bend more allowing for more bending energy storage.

In FIG. 6, the novel hybrid probe (602) includes an additional angular element (605) which causes both torsional and bending energy absorption (shown by arrows 607 and 608, respectively) in element 610. The bending element (615) transfers some of the displacement energy through the union angle (620) to the torsion/bending element (610). A second angular element could be added to the bending element (615), similar to the one described above with reference to FIG. 5, allowing the bending element (615) to also store torsional energy. The position of the pivot (625) can also be adjusted to fine tune the torsional and bending energy absorption. In the current pivot configuration, however, the ratio of the probe's (602) torsion/bending absorption is about 35:65.

Finally, the torsional and cantilever characteristics of the novel probe card can be adjusted by manipulating the angle of their union and/or the angle of the additional angular elements. On one extreme, if the angle is near zero then there will be little to no torsion exerted on the torsion element. On the other extreme, if the angle is 90 degrees (or 270 degrees), the torsion element will experience more torsion. From these two extremes, it would be apparent to one of skill in the art that a minor change in the angle can fine tune the torsional/cantilever characteristics of the hybrid probe.

By using the embodiments described herein, it is possible to manufacture a hybrid probe that exploits the advantages of the torsional and cantilever designs. The benefit of both torsional and bending energy absorption is that the probe more efficiently absorbs the displacement energy across more of the probe's volume, thus reducing the need to reinforce the probe. Because the hybrid probe tip will present a smaller contact area than a pure cantilever design to the DUT contact pad (due to the hybrid probe's larger tip contact angle), the hybrid probe would need less force to achieve a reliable electrical contact with the DUT. This results in a probe card that is more efficient and cost effective with higher packing densities, lower failure rates and less probe failure due to material fatigue from excessive stress. Fine tuning the hybrid through pivot placement, additional angular elements, and modifications to moments of inertia, allows for customization to particular applications that further increase the probe card efficiency and cost effectiveness.

While the description above refers to particular embodiments of the present invention, it should be readily apparent to people of ordinary skill in the art that a number of modifications may be made without departing from the spirit thereof. The accompanying claims are intended to cover such modifications as would fall within the true spirit and scope of the invention. The presently disclosed embodiments are, therefore, to be considered in all respects as illustrative and not restrictive, the scope of the invention being indicated by the appended claims rather than the foregoing description. All changes that come within the meaning of and range of equivalency of the claims are intended to be embraced therein. Moreover, the applicants expressly do not intend that the following claims "and the embodiments in the specification to be strictly coextensive." *Phillips v. AHW Corp.*, 415 F.3d 1303, 1323 (Fed. Cir. 2005) (en banc).

The invention claimed is:

1. A probe card for testing a semiconductor device, comprising:
    a substrate;
    a hybrid probe connected to the substrate, the probe comprising a base that is connected to the substrate, a torsion element connected to the base, a bending element connected to the torsion element through a union angle, and a probe tip connected to the bending element; wherein the probe elastically stores displacement energy while the probe tip contacts the device; and
        wherein the torsion element is adapted to twist such that the torsion element elastically stores a first portion of displacement energy and the bending element is adapted to bend such that the bending element elastically stores a second portion of the displacement energy;
    a pivot connected to the substrate, wherein a portion of the probe is configured to contact the pivot; and
        wherein a ratio between the first portion of displacement energy and the second portion of displacement energy is in the range from about 15:85 to 85:15.

2. The probe card of claim 1, wherein the ratio between the first portion of displacement energy and the second portion of displacement energy is in the range from about 30:70 to 50:50.

3. The probe card of claim 1 wherein the bending element and the torsion element are manufactured using photolithography.

4. The probe card of claim 3 wherein the torsion element is manufactured using a first photolithographic layer, and the bending element is manufactured using a second photolithographic layer.

5. The probe card of claim 1 wherein the torsion element is comprised of a first material and the bending element is comprised of a second material.

6. The probe card of claim 5 wherein the first material has a higher Young's Modulus than the second material.

7. The probe card of claim 5 wherein the first material has a lower Young's Modulus than the second material.

8. The probe card of claim 5 wherein the first material has substantially the same Young's Modulus as the second material.

9. The probe card of claim 1 wherein the torsion element is constructed to achieve a polar moment of inertia that allows the torsion element to twist such that the first portion of displacement energy is greater than the second portion of displacement energy.

10. The probe card of claim 1 wherein the bending element is constructed to achieve a moment of inertia that allows the bending element to bend such that the second portion of displacement energy is greater than the first portion of displacement energy.

11. The probe card of claim 1 wherein the torsion element or bending element is a split bar.

12. The probe card of claim 1 wherein the torsion element is adapted to bend such that the torsion element elastically stores a third portion of the displacement energy through bending.

13. The probe card of claim 1 wherein the bending element is adapted to twist such that the bending element elastically stores a third portion of the displacement energy through torsion.

14. The probe card of claim 1 wherein the pivot is connected to the substrate at a position, and wherein the position of the pivot is selected to achieve a desired characteristic that is selected from a group consisting of: scrub length, probe pressure, packing density, probe failure from material fatigue, uniform stress distribution, and combinations thereof.

15. The probe card of claim 1 wherein the union angle comprises an angle.

16. The probe card of claim 1, wherein the torsion element comprises an additional angular element that is comprised of an angle.

17. The probe card of claim 1, wherein the bending element comprises an additional angular element that is comprised of an angle.

18. The probe card of claim 1, wherein the torsion element comprises an additional angular element that is comprised of an angle and the bending element comprises an additional angular element that is comprised of an angle.

19. The probe card of claim 16 wherein the angle is in the range from about 90 to 270 degrees.

20. The probe card of claim 19 wherein the angle is selected to achieve a desired characteristic that is selected from a group consisting of: scrub length, probe pressure, packing density, probe failure from material fatigue, uniform stress distribution, and combinations thereof.

21. The probe card of claim 1, wherein the bending element is comprised of a nickel alloy.

22. The probe card of claim 1, wherein the torsion element is comprised of a nickel alloy.

23. The probe card of claim 1 wherein the probe further comprises a probe post connected to the probe tip, wherein the surface of the probe post is manufactured such that the probe post is configured to be optically distinguished from the probe tip.

24. The probe card of claim 1 wherein the bending element is wider and thinner than the torsional element.

25. The probe card of claim 24 wherein the bending element is comprised of a first material with a Young's Modulus and the torsion element is comprised of a second material with a Young's Modulus, wherein the first material's Young's Modulus is less than the second material's Young's Modulus.

26. The probe card of claim 1 wherein the bending element is shorter than the torsional element.

27. The probe card of claim 26 wherein the bending element is comprised of a first material with a Young's Modulus and the torsion element is comprised of a second material with a Young's Modulus, wherein the first material's Young's Modulus is greater than the second material's Young's Modulus.

28. The probe card of claim 1 wherein the portion of the probe contacts the pivot while the probe tip contacts the device.

* * * * *